US012463165B2

(12) United States Patent
Hu et al.

(10) Patent No.: US 12,463,165 B2
(45) Date of Patent: Nov. 4, 2025

(54) BONDING STRUCTURE AND MANUFACTURING METHOD THEREFOR

(71) Applicant: Wuhan Xinxin Semiconductor Manufacturing Co., Ltd., Hubei (CN)

(72) Inventors: Xing Hu, Wuhan (CN); Tianjian Liu, Wuhan (CN); Sheng Hu, Wuhan (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 519 days.

(21) Appl. No.: 17/797,603

(22) PCT Filed: Mar. 24, 2020

(86) PCT No.: PCT/CN2020/080805
§ 371 (c)(1),
(2) Date: Aug. 4, 2022

(87) PCT Pub. No.: WO2021/159588
PCT Pub. Date: Aug. 19, 2021

(65) Prior Publication Data
US 2023/0053721 A1  Feb. 23, 2023

(30) Foreign Application Priority Data
Feb. 12, 2020 (CN) .......................... 202010088771.6

(51) Int. Cl.
H01L 31/102 (2006.01)
H01L 23/00 (2006.01)

(52) U.S. Cl.
CPC .............. *H01L 24/08* (2013.01); *H01L 24/80* (2013.01); *H01L 2224/0401* (2013.01);
(Continued)

(58) Field of Classification Search
CPC ..... H01L 24/08; H01L 24/80; H01L 2224/05; H01L 2224/80885; H01L 2224/80895;
(Continued)

(56) References Cited

U.S. PATENT DOCUMENTS 9,704,827 B2 * 7/2017 Huang ................. H10F 39/809
2015/0249060 A1   9/2015 Gregorich et al.
(Continued)

FOREIGN PATENT DOCUMENTS

CN  102244056 A  11/2011
CN  106298715 A   1/2017
(Continued)

OTHER PUBLICATIONS

International Search Report (English and Chinese) and Written Opinion of the International Searching Authority (Chinese) issued in PCT/CN2020/080805, mailed Oct. 28, 2020; ISA/CN.

*Primary Examiner* — Niki H Nguyen
(74) *Attorney, Agent, or Firm* — Harness, Dickey & Pierce, P.L.C.

(57) ABSTRACT

A bonding structure and a manufacturing method therefor. A first hybrid bonding structure is formed on a first wafer; an interconnection structure and a second hybrid bonding structure are formed on the front surface of a second wafer. The first wafer and the second wafer are bonded by means of the first hybrid bonding structure and the second hybrid bonding structure, a gasket electrically connected to the interconnection structure is formed on the back surface of the second wafer, and the interconnection structure below the gasket and a second conductive bonding pad in the second hybrid bonding structure are provided in a staggered manner in the horizontal direction. According to the solution, the interconnection structure and the second conductive bonding pad are arranged in a staggered manner, so that recesses generated (Continued)

by structural stacking are avoided, and device failure caused by the recesses is further avoided.

12 Claims, 4 Drawing Sheets

(52) U.S. Cl.
CPC ................ *H01L 2224/05* (2013.01); *H01L 2224/80885* (2013.01); *H01L 2224/80895* (2013.01)

(58) Field of Classification Search
CPC ....... H01L 2224/80896; H01L 25/0657; H01L 24/05; H01L 23/5226; H01L 24/06; H01L 2224/08; H01L 2224/09517; H01L 2224/0401; H01L 2225/06517; H01L 23/49816; H01L 24/02; H01L 2224/32145; H01L 24/16; H01L 2224/08135; H01L 23/49827; H01L 2224/05009; H01L 2224/05548; H01L 33/0093; H01L 2224/83203; H01L 2224/73259; H01L 2224/8012; H01L 2224/82031

See application file for complete search history.

(56) References Cited

U.S. PATENT DOCUMENTS

| | | |
|---|---|---|
| 2016/0379960 A1 | 12/2016 | Huang et al. |
| 2017/0092680 A1 | 3/2017 | Kwon |
| 2019/0157333 A1 | 5/2019 | Tsai |
| 2020/0035622 A1 | 1/2020 | Wu et al. |
| 2020/0075550 A1 | 3/2020 | Ye |
| 2020/0388586 A1 | 12/2020 | Zhan et al. |
| 2021/0028151 A1 | 1/2021 | Li et al. |
| 2021/0057309 A1* | 2/2021 | Hu ...................... H01L 23/5283 |

FOREIGN PATENT DOCUMENTS

| | | |
|---|---|---|
| CN | 107017229 A | 8/2017 |
| CN | 109192718 A | 1/2019 |
| CN | 110223922 A | 9/2019 |
| CN | 110379790 A | 10/2019 |

\* cited by examiner

BONDING STRUCTURE AND MANUFACTURING METHOD THEREFOR

This application is the national phase of International Application No. PCT/CN2020/080805, titled "BONDING STRUCTURE AND MANUFACTURING METHOD THEREFOR", filed on Mar. 24, 2020, which claims priority to Chinese Patent Application No. 202010088771.6, titled "BONDING STRUCTURE AND METHOD FOR MANUFACTURING THE SAME", filed on Feb. 12, 2020 with the China National Intellectual Property Administration, the entire disclosures of the above applications are expressly incorporated herein by reference.

FIELD

The present disclosure relates to the field of semiconductor devices and manufacture thereof, and in particular to a bonding structure and a method for manufacturing the bonding structure.

BACKGROUND

As semiconductor technology enters the post-Moore era, chip structures are going three-dimensional on demands of high-degree integration and high performances, and wafer-level bonding techniques are widely applied. Hybrid bonding is an example of wafer-level bonding. In the hybrid bonding, wafers are bonded via a bonding pad and a dielectric layer, and then an aluminum pad is formed on a backside of the wafer. Generally, the aluminum pad has a large area, for example, an area larger than 40 μm×40 μm. During manufacturing, a large metal pad is apt to suffer from recesses and even defects, which results in failure of devices.

SUMMARY

In view of the above, an objective of the present disclosure is to provide a bonding structure and a method for manufacturing the bonding structure, which can avoid recesses causing device failure.

Following technical solutions are provided according to embodiments of the present disclosure in order to achieving the above objective.

A bonding structure is provided, including: a first wafer, where a first hybrid bonding structure is formed on the first wafer, and the first hybrid bonding structure includes a first dielectric bonding layer and a first conductive bonding pad; a second wafer, where a front side of the second wafer is bonded to a front side of the first wafer, an interconnection structure and a second hybrid bonding structure disposed above the interconnection structure are formed at the front side of the second wafer, the second hybrid bonding structure includes a second dielectric bonding layer and a second conductive bonding pad, and the first wafer and the second wafer are bonded to each other via the first hybrid bonding structure and the second hybrid bonding structure; and a pad, which is formed at a backside of the second wafer and electrically connected to the interconnection structure, where the interconnection structure and the second conductive bonding pad are disposed under the pad in a non-overlapping manner along a horizontal direction.

In an embodiment, slots in adjacent interconnection layers of the interconnection structure are arranged in a non-overlapping manner.

In an embodiment, vias for adjacent layers of the interconnection structure are arranged in a non-overlapping manner.

In an embodiment, the pad is formed within an opening in a substrate of the second wafer.

In an embodiment, a part of the pad is formed within an opening in a substrate of the second wafer, and another part of the pad covers a part of a back surface of the second wafer.

A method for manufacturing a bonding structure is provided, including: providing a first wafer, where a first hybrid bonding structure is formed on the first wafer, and the first hybrid bonding structure includes a first dielectric bonding layer and a first conductive bonding pad; providing a second wafer, where an interconnection structure and a second hybrid bonding structure disposed above the interconnection structure are formed at a front side of the second wafer, the second hybrid bonding structure includes a second dielectric bonding layer and a second conductive bonding pad; bonding the front side of the second wafer to a front side of the first wafer via the first hybrid bonding structure and the second hybrid bonding structure; and forming a pad at a backside of the second wafer, where the pad is electrically connected to the interconnection structure, and the interconnection structure and the second conductive bonding pad are disposed under the pad in a non-overlapping manner along a horizontal direction.

In an embodiment, slots in adjacent interconnection layers of the interconnection structure are arranged in a non-overlapping manner.

In an embodiment, vias for adjacent layers of the interconnection structure are arranged in a non-overlapping manner.

In an embodiment, forming the pad at the backside of the second wafer includes: forming an opening in a substrate where the second wafer is located; and forming the pad within the opening.

In an embodiment, forming the pad at the backside of the second wafer includes: forming an opening in a substrate where the second wafer is located; and forming the pad, where a part of the pad is formed within the opening, and another part of the pad covers a part of a back surface of the second wafer.

The bonding structure and the method for manufacturing the bonding structure are provided in embodiments of the present disclosure. The first hybrid bonding structure is formed on the first wafer. The interconnection structure and the second hybrid bonding structure are formed on a front side of a second wafer. The first wafer and the second wafer are bonded to each other via the first hybrid bonding structure and the second hybrid bonding structure. The pad is formed at the backside of the second wafer and is electrically connected to the interconnection structure. The interconnection structure and the second conductive bonding pad in the second hybrid bonding structure are disposed under the pad in the non-overlapping manner along the horizontal direction. In the above solution, the non-overlapping arrangement of the interconnection structure and the conductive bonding pads in the hybrid bonding structures prevents a recess generated due to stacking of structures, and thereby avoids device failure caused by the recess.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

In order to make objectives, features and advantages of the present disclosure clear and easy to comprehend, hereinafter embodiments of the present disclosure are described in detail in conjunction with the drawings.

Many specific details are illustrated in following description to facilitate a full understanding of the present disclosure. The present disclosure may be practiced in another manner besides those described herein. Those skilled in the art can analogize without departing from the scope of the present disclosure. Therefore, the present disclosure is not limited to specific embodiments disclosed hereinafter.

The present disclosure is described in detail in conjunction with the drawings. To facilitate description in describing embodiments of the present disclosure in detail, a sectional view showing a structure of a device is not partially enlarged on a general scale. The schematic diagram is merely exemplary, and the protection scope of present disclosure should not be limited thereto. In addition, the three-dimensional spatial dimensions of length, width and depth should be included in practical manufacture.

Figure 7:
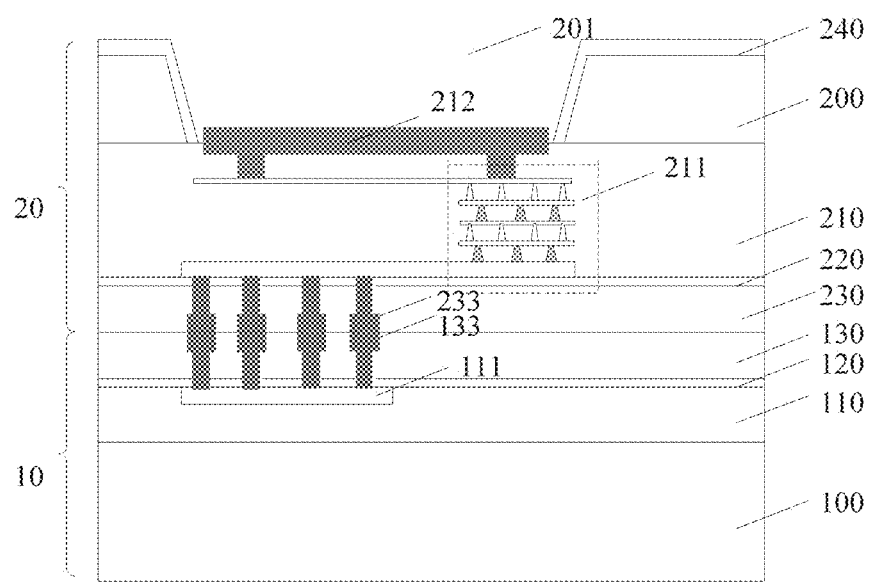
Figure 8:
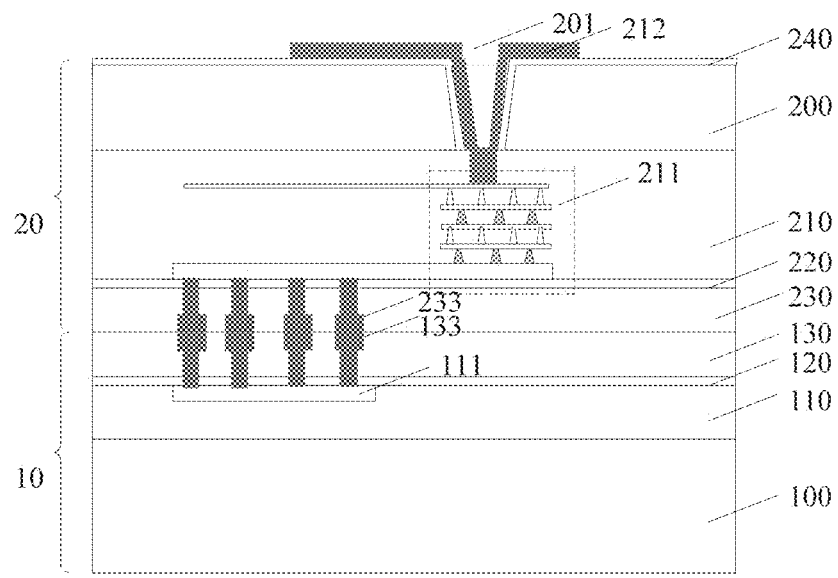

As described in the background, hybrid bonding refers to bonding wafers via a bonding pad and a dielectric layer and then forming an aluminum pad at a backside of a wafer. Generally, the aluminum pad has a large area, and a large metal pad is apt to suffer from recesses and even defects during manufacturing, which results in failure of devices In view of the above, a bonding structure is provided according to embodiments of the present disclosure. Reference is made to FIG. 7 and FIG. 8. The bonding structure includes a first wafer 10, a second wafer 20, and a pad 212.

A first hybrid bonding structure is formed on the first wafer 10. The first hybrid bonding structure includes a first dielectric bonding layer 130 and a first conductive bonding pad 133.

A front side of the second wafer 20 is bonded to a front side of the first wafer 10. An interconnection structure 211 and a second hybrid bonding structure disposed above the interconnection structure 211 are formed at the front side of the second wafer 20. The second hybrid bonding structure includes a second dielectric bonding layer 230 and a second conductive bonding pad 233. The first wafer 10 and the second wafer 20 are bonded to each other via the first hybrid bonding structure and the second hybrid bonding structure.

The pad 212 is formed at a backside of the second wafer 20 and electrically connected to the interconnection structure 211. The interconnection structure 211 and the second conductive bonding pad 233 are disposed under the pad 212 in a non-overlapping manner along a horizontal direction.

In embodiments of the present disclosure, devices may have been fabricated and respective hybrid bonding structures may have been formed on a substrate in the first wafer 10 and second wafer 20. A device structure and an interconnection structure electrically connected to the device structure may have been formed on the substrate. The device structure is covered by a dielectric layer, and the dielectric layer may include multiple layers, such as an inter-layer dielectric layer and an inter-metal dielectric layer. The interconnection structure is formed in the dielectric layer. The device structure may be of a MOS device, a sensing device, a memory device and/or other passive devices. The interconnection structure may include multiple layers, and these layers may be connected to each other via contact plugs, wiring layers, vias, or the like. The interconnection structure may be made of metal, such as tungsten, aluminum, or copper.

After the device is fabricated, a hybrid bonding structure is formed on a surface of a wafer. Such surface is a surface at which the device structure is formed, and may be called the front side of the wafer. The "hybrid" bonding structure refers to that a bonding interface is formed by different bonding materials. Herein the hybrid bonding structure includes a dielectric bonding layer and a conductive bonding pad, and the conductive bonding pad is formed in the dielectric bonding layer and is electrically connected to the interconnection structure in the wafer. Generally, the conductive bonding pad is formed on a topmost wiring layer in the wafer and is electrically connected to the top layer wiring, hence providing an electrical lead for the interconnection structure in the wafer. The dielectric bonding layer may be made of a dielectric material for boding, and may be a single layer or multiple layers. For example, the dielectric bonding layer may be silicon oxide (bonding oxide), silicon nitride, NDC (nitrogen-doped silicon carbide), or a combination thereof. The conductive bonding pad may be made of a conductive material for bonding, such as copper.

Figure 4:
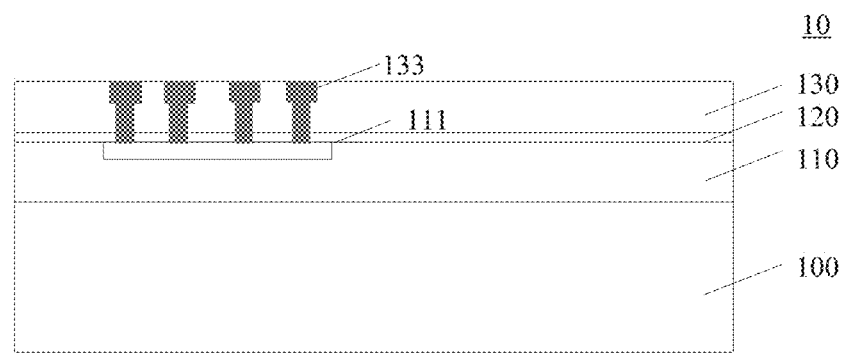

Reference is made to FIG. 4. In an embodiment, the first wafer 10 includes a substrate 100. The substrate 100 may be a semiconductor substrate, such as a Si substrate, a Ge substrate, a SiGe substrate, an SOI (silicon on insulator) substrate, or a GOI (germanium on insulator) substrate. A first dielectric layer 110 is formed on the substrate 100. A device structure and an interconnection structure (which are not indicted in FIG. 4, except the topmost interconnection layer 111) are formed in the first dielectric layer 110. The first dielectric layer 110 protects the device structure and the interconnection structure from damages. The first dielectric layer 110 may be made of silicon oxide. A first etching stop layer 120 may be formed between the first dielectric layer 110 and the first dielectric bonding layer 130. The first etching stop layer 120 is for an etching process for forming the first conductive bonding pad 133. The first etching stop layer 120 may be made of silicon nitride, and is capable to serve as a diffusion barrier. The first dielectric bonding layer 130 is formed above the first etching stop layer 120. The first dielectric bonding layer 130 and the first conductive bonding pad 133 in the first dielectric bonding layer 130 form the first hybrid bonding structure. The first conductive bonding pad 133 is electrically connected to the topmost interconnection layer 111, hence leading the interconnection structure electrically to outside.

Figure 5:
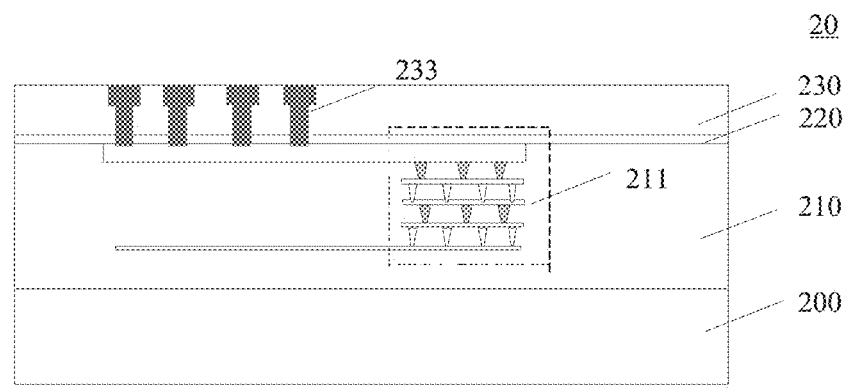

The second wafer 20 and the first wafer 10 may be identical or different. Reference is made to FIG. 5. The second wafer 20 includes a substrate 200. A second dielectric layer 210 is formed on the substate 200. A device structure (which is not depicted in FIG. 5) and an interconnection structure 211 are formed in the second dielectric layer 210. The second dielectric layer 210 is disposed on the substrate 200, and the interconnection structure 211 is formed in the second dielectric layer 210. That is, the interconnection structure 211 is formed at the front side of the second wafer 20. A second etching stop layer 220 may be formed between the second dielectric layer 210 and the second dielectric bonding layer 230. The second etching stop layer 220 is for an etching process for forming the second conductive bonding pad 233. The second etching stop layer 220 may be identical to or different from the etching stop layer 120 in terms of structure or material. The second dielectric bonding layer 230 and the second conductive bonding pad 233 in the second dielectric bonding layer 230 form the second hybrid bonding structure. The second hybrid bonding structure is electrically connected to the interconnection structure 211.

Figure 6:
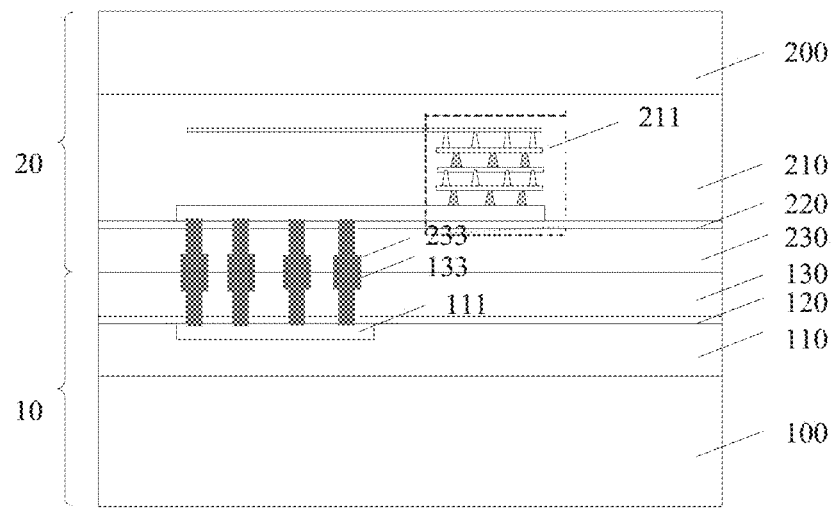

Reference is made to FIG. 6. The first wafer 10 and the second wafer 20 are bonded to each other via the first hybrid bonding structure and the second hybrid bonding structure. Reference is made to FIG. 7. After bonding the first wafer 10 and the second wafer 20, a pad 212 electrically connected to the interconnection structure 211 is formed at a backside of the second wafer 20, and thereby the interconnection structure 211 is electrically led to outside. The pad 212 may be made of metal, such as aluminum. An area of the pad 212 is, for example, 50 μm×50 μm. The interconnection structure 211 and the second hybrid bonding structure are disposed in different regions under the pad 212. For example, the interconnection structure 211 may be disposed at a right part of the bonded wafers, and the second hybrid bonding structure may be disposed at a left part of the bonded wafers. The interconnection structure 211 and the second conductive bonding pad 233 in the second hybrid bonding structure are arranged in a non-overlapping manner, so as to avoid a local recess which is caused by stacking of multiples layers of structures and which affects the subsequent bonding.

Figure 9:
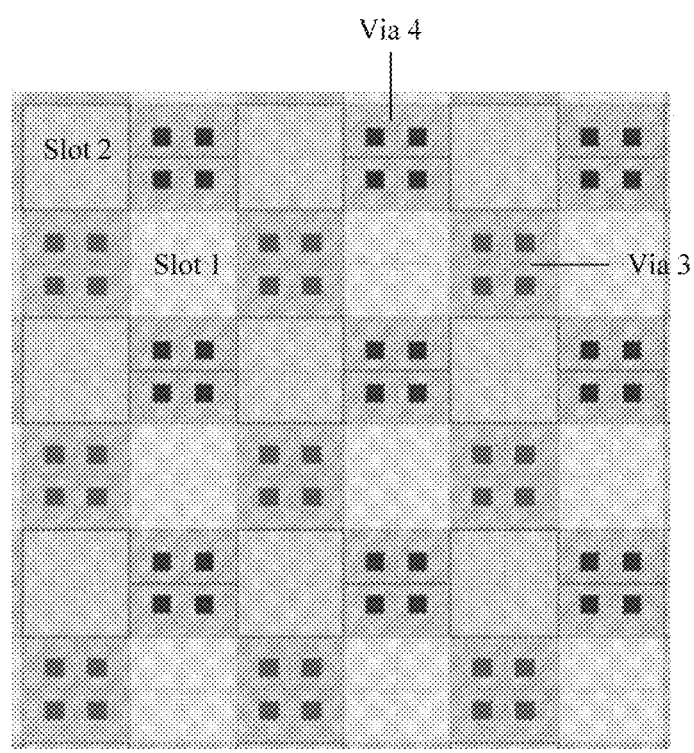
FIG. 9 shows a schematic structural diagram of a top view of an interconnection structure in a bonding structure according to an embodiment of the present disclosure.

Reference is made to FIG. 9, which is a schematic structural diagram of a top view of the interconnection structure 211. In an embodiment, slots in adjacent interconnection layers in the interconnection structure 211 are arranged in a non-overlapping manner. That is, the slots in adjacent interconnection layers do not overlap with each other when viewed along the vertical direction. As shown in FIG. 9, slot 1 in an interconnection layer does not overlap with slot 2 in another interconnection layer adjacent to the interconnection layer. The non-overlapping arrangement of the slots in the interconnection layers is capable to effectively alleviate recess accumulation which would have been caused by just alignment of multiple slots, and prevent a recess from being generated and affecting performances of the device during subsequent chemical mechanical polishing for planarizing the dielectric layer to form a pad. Reference is further made to FIG. 9. In another embodiment, vias for adjacent layers of the interconnection structure 211 are arranged in a non-overlapping manner. That is, the vias connecting an interconnection layer and one adjacent interconnection layer do not overlap with those connecting the interconnection layer and the other adjacent interconnection layer when viewed along a vertical direction. For example, vias 3 may connect a first interconnection layer of the interconnection structure and a second interconnection layer of the interconnection structure, vias 4 may connect the second interconnection layer and a third interconnection layer of the interconnection structure, and vias 3 and vias 4 do not overlap with each other when viewed along the vertical direction. Thereby, it is prevented that stacking of the structures results in a lot of recesses, and thus generation of recesses is suppressed before the bonding.

Reference is made to FIG. 7. In one embodiment, the pad 212 is formed within an opening in the substrate 200 of second wafer 20. The pad 212 is electrically connected to the interconnection structure 211 in the dielectric layer 210, and leads the interconnection structure 211 electrically to outside. The interconnection structure 211 and the second conductive bonding pad 233 in the second hybrid bonding structure are disposed under the pad 212 in the non-overlapping manner. Generation of recesses can be avoided without increasing an area of the pad 212 or affecting a contact resistance. Chemical mechanical polishing may be may be performed after forming of the interconnection structure 211 to improve stability of the subsequent bonding. The chemical mechanical polishing is apt to generate recesses, which can be effectively prevented by using the non-overlapping arrangement of the structures.

Reference is made to FIG. 8. In an embodiment, an opening 201 is formed in the substrate 200 of the second wafer 20. A part of the pad 212 is formed within the opening 201, and another part of the pad 212 covers a part of a back surface of the second wafer 20. The opening in this embodiment is smaller than the opening in the embodiment as shown in FIG. 7. For example, a dimension of the opening in this embodiment is only required to be 20% of a dimension of the opening in the embodiment as shown in FIG. 7. In this embodiment, the pad 212 is formed both at the back surface of the substrate 200 and in the opening 201, and hence the pad 212 occupies a smaller area of the wafer and consumes less substate in the bonding. Herein the bonding pad 233 and the interconnection structure 211 are formed in different regions, and the pad 212 is formed at the back surface of the second wafer 20, which can reduce significantly an area occupied by the pad on the bonded wafers. In a specific embodiment, the area occupied by the pad may be reduced by fifty percent.

After the pad is formed on the bonded wafers, subsequent operations such as packaging may be performed.

Hereinabove the bonding structure is described in detail. A method for manufacturing a bonding structure is further provided according to embodiment of the present disclosure. Hereinafter the method is described in detail in conjunction with the drawings.

Figure 1:
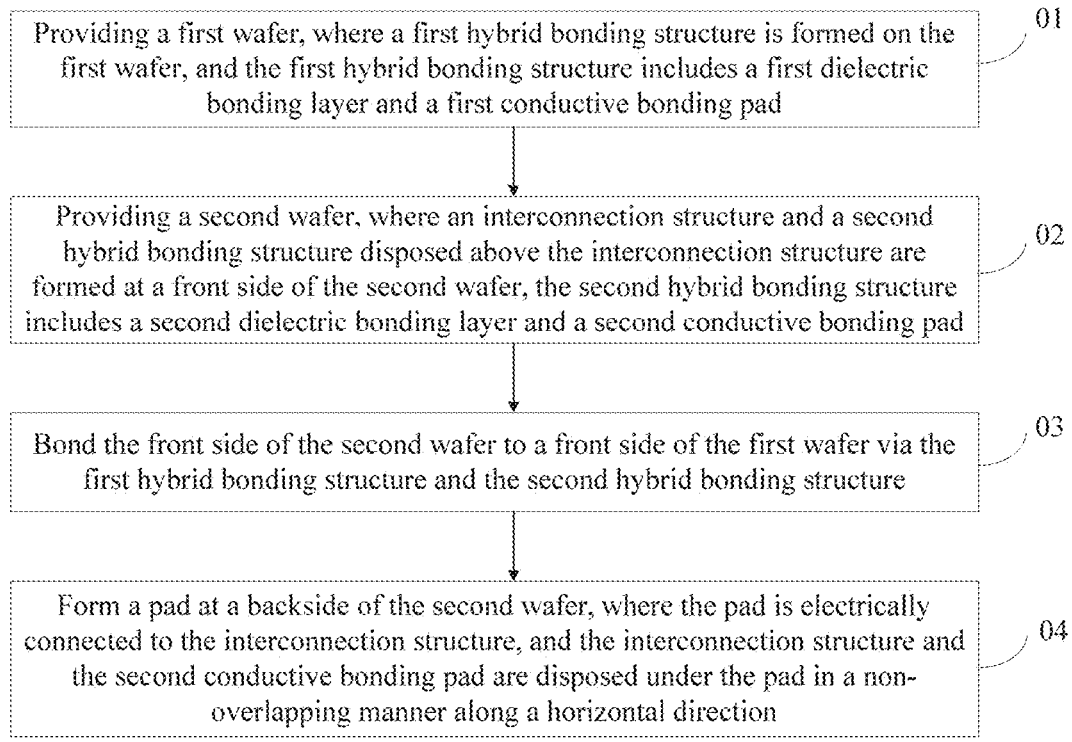
FIG. 1 shows a schematic flowchart of a method for manufacturing a bonding structure according to an embodiment of the present disclosure.
Figure 2:
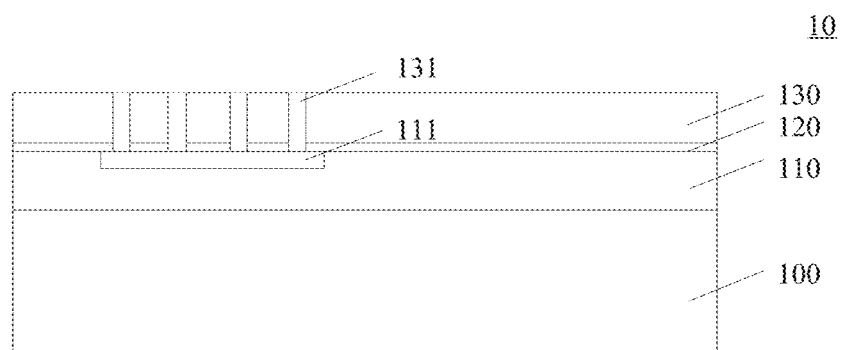
FIG. 2 to FIG. 8 each shows a schematic structural diagram in a process of manufacturing a bonding structure according to an embodiment of the present disclosure.

Reference is made to FIG. 1. In step S01, a first wafer 10 is provided. A first hybrid bonding structure is formed on the first wafer 10, and the first hybrid bonding structure includes a first dielectric bonding layer 130 and a first conductive bonding pad 133, as shown in FIG. 2.

In an embodiment, a device structure and an interconnection structure electrically connected to the device structure may have been formed on a substrate 100 in the first wafer 10. FIG. 2 only illustrates a topmost interconnection layer 111 in the interconnection structure. The substrate 100 may be a semiconductor substrate, such as a Si substrate, a Ge substrate, a SiGe substrate, an SOI (silicon on insulator) substate, or a GOI (germanium on insulator) substrate. The device structure is covered by a first dielectric layer 110, and the topmost interconnection layer 111 is formed in the dielectric layer. The topmost interconnection layer 111 may be made of metal, such as tungsten, aluminum, or copper.

The first hybrid bonding structure is formed on the first wafer 10. The first hybrid bonding structure may be formed at a front side of the first wafer 10, where the front side of the first wafer structure 10 refers to a surface on which the device structure is formed. Herein the hybrid bonding structure includes a first dielectric bonding layer 130 and a first conductive bonding pad 133. The first conductive bonding pad 133 is formed in the dielectric bonding layer 130 and is electrically connected to a topmost interconnection layer 111 in the wafer. Reference is made to FIG. 4. Generally, the first conductive bonding pad 133 is formed on the topmost interconnection layer 111 of the wafer, and is electrically connected to the topmost interconnection layer 111, so as to lead the interconnection layer electrically from the wafer to outside. The first conductive bonding pad 133 may have an appropriate structure, for example, may include a connection hole at a bottom and a via on the connection hole.

Figure 3:
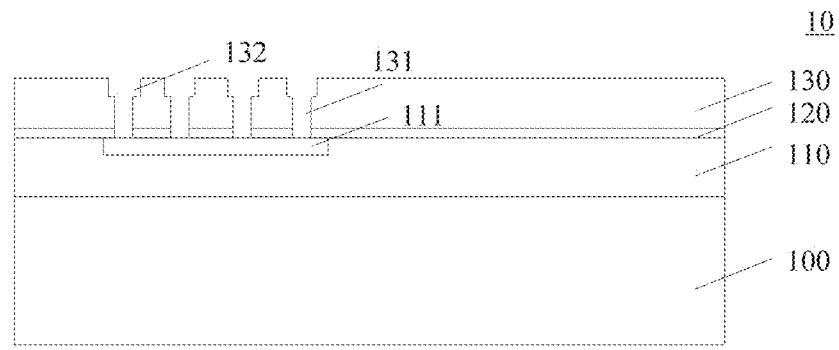

In an embodiment, a process of forming the first conductive bonding pad 133 may include following steps. A photoresist layer is formed on the first dielectric bonding layer 130. A pattern of connection holes 131 is transferred onto the photoresist layer through photolithography. The first dielectric bonding layer 130 is etched by using the photoresist layer as a mask, and an etching stop layer 120 may be applied to the etching to avoid over-etching into the first dielectric layer 110. Then, the first dielectric bonding layer 130 and the etching stop layer 120 may be further etched until reaching the first dielectric layer 110, such that the connection holes 131 are formed in the first dielectric bonding layer 130. The photoresist layer is removed to obtain a structure as shown in FIG. 2. The connection holes 131 are filled with metal material, and a metal layer is simultaneously formed on the first dielectric bonding layer 130. A mask layer is formed on the metal layer, and the metal layer and a part of the first dielectric bonding layer 130 are etched by using the mask layer as a mask, such that vias 132 above the connection holes 131 are formed in the first dielectric bonding layer 130. The filling material is removed from in the connection holes 131. Thereby, bonding holes composed of the connection holes 131 and the via holes 132 are formed in the dielectric bonding layer 130, as shown in FIG. 3. A metal material is filled into the bonding holes, and planarization is performed to remove the overflowing metal material on the first dielectric bonding layer 130. Hence, the first conductive bonding pad 133 is formed in the first dielectric bonding layer 130, as shown in FIG. 4.

In step S02, a second wafer 20 is provided. An interconnection structure 211 and a second hybrid bonding structure disposed above the interconnection structure 211 are formed at a front side of the second wafer 20. The second hybrid bonding structure includes a second dielectric bonding layer 230 and a second conductive bonding pad 233, as shown in FIG. 5.

The second wafer 20 and the first wafer 10 may be identical or different. A device structure and the interconnection structure 211 electrically connected to the device structure may have been be formed on the second wafer 20. The interconnection structure 211 is formed at the front side, that is, at a surface on which the device structure is formed, of the second wafer 20. Reference is made to FIG. 5. The interconnection structure 211 is formed in a second dielectric layer 210. A material of the second dielectric layer 210 may be the same as that of the first dielectric layer 110, for example, may be silicon oxide. The interconnection structure 211 is electrically connected to the second conductive bonding pad 233 in the second hybrid bonding structure, so that the second conductive bonding pad 233 leads the interconnection structure 211 electrically to outside.

In ab embodiment, slots in adjacent interconnection layers in the interconnection structure 211 arranged in a non-overlapping manner. Reference is made to FIG. 9. The slots in adjacent interconnection layers do not overlap when viewed along the vertical direction, which alleviates recess accumulation in subsequent planarization through chemical mechanical polishing. Thereby, it is prevented that recesses affects the bonding. In a specific embodiment, vias for adjacent layers of the interconnection structure 211 are arranged in the non-overlapping manner. That is, via holes connecting adjacent layers do not overlap when viewed along the vertical direction, which further avoids generation of a recess.

In step S03, the front side of the second wafer 20 is bonded to the front side of the first wafer 10 via the first hybrid bonding structure and the second hybrid bonding structure. Reference is made to FIG. 6.

The front side of the second wafer 20 is bonded to the front side of the first wafer 10 via the first hybrid bonding structure of the first wafer 10 and the second hybrid bonding structure of the second wafer 20. The first conductive bonding pad 133 in the first wafer 10 is aligned with the second conductive bonding pad 233 in the second wafer 20. The bonding connection between the first wafer 10 and the second wafer 20 is achieved by a bonding force between the first hybrid bonding structure and the second hybrid bonding structure.

In step S04, a pad 212 is formed at a backside of the second wafer 20. The pad 212 is electrically connected to the interconnection structure 211. The interconnection structure 211 and the second conductive bonding pad 233 in the second hybrid bonding structure are disposed in different regions under the pad 212, as shown in FIG. 7 and FIG. 8.

In an embodiment, the pad 212 is formed at the backside of the second wafer 20 and is electrically connected to the interconnection structure 211, so that the interconnection structure 211 is electrically led to outside. The interconnection structure 211 and the second conductive bonding pad 233 in the second hybrid bonding structure are disposed in different regions under the pad 212. For example, the interconnection structure 211 is located at a right part under the pad 212, and the second hybrid bonding structure is located at a left part under the pad 212. The non-overlapping arrangement of the interconnection structure 211 and the second conductive bonding pad 233 in the second hybrid bonding structure avoids recesses caused by stacking of structures, and thereby it is prevented that the recesses affects the bonding.

In an embodiment, in step S4101, an opening 201 is formed in a substrate 200 of the second wafer 20. A dimension of the opening is, for example, greater than 50 μm×50 μm. A process of forming the opening may include following steps. A mask layer is formed on a back surface of the substrate 200. The substrate 200 is etched by using the mask layer as a mask, so as to form the opening 201 in the substrate 200. The mask layer is the removed. In step S4102, the pad 212 electrically connected to the interconnection structure 211 is formed within the opening. A specific process of step S4102 may include following steps. After the opening 201 exposing the second dielectric layer 210 is exposed, an insulating layer 240 is formed within the opening 201. The insulating layer 240 is configured to isolate the pad 212 from the substrate 200, in order to avoid diffusion of metal material affects the substrate 200. A material of the insulating layer 240 may be the same as that of the second dielectric layer 210, such as silicon oxide. The material of the insulating layer 240 may be different from that of the second dielectric layer 210. The material of the insulating layer 240 may be a photoresist material, or a photoresist layer may be formed on the insulating layer 240 at a bottom of the opening 201. A pattern of connection holes may be formed on the photoresist layer through exposure, development, and other processes. The second dielectric layer 210 is etched by using the photoresist layer as a mask to form the connection holes in the second dielectric layer 210. The connection holes are small holes for exposing the interconnection structure 211. The connection holes and the opening are filled with metal material. Then, the metal material on a sidewall of the opening 201 and the overflowing metal material on the substrate 200 are removed to form the pad 212 in the opening 201. Reference is made to FIG. 7. The pad 212 leads the interconnection structure in the bonded wafers electrically to outside. It is avoided that recesses generated by performing chemical mechanical polishing on the interconnection structure 211 affects the bonding, without increasing an area of the pad 212 or affecting a contact resistance.

In another embodiment, in step S4201, an opening 201 is formed in the substrate 200 of the second wafer 20, and a dimension of the opening 201 is only 20% of that in the foregoing embodiment. For example, the dimension of the opening 201 is 10 µm×10 µm. A process of forming the opening is the same as the step S4101 in the foregoing embodiment. In step S4202, after the opening 201 is formed at the backside of the substrate 200, an insulating layer 240 is deposited in the opening 201, and the insulating layer 240 is configured to protect the substrate 200 from being affected by diffusion of metal material. The insulating layer 240 at a bottom of the opening 201 and the second dielectric layer 210 are etched until exposing the interconnection structure 211, so as to form connection holes. A metal material is filled into the connection holes and the opening. Afterwards, a part of the overflowing metal material over the substrate 200 is removed to form the pad 212. Hence, a part of the pad 212 is formed within the opening in the substrate 200 of the second wafer 20, and another part of the pad 212 covers a part of the back surface of the second wafer 20, as shown in FIG. 8. The pad 212 leads the interconnection structure 211 electrically from the bonded wafers to outside. The metal material is deposited on the back surface of the substrate 200 when the opening 201 being filled, and a part of the metal material at the back surface of the substrate 200 is removed, so that the pad 212 is formed both within the opening 201 and at the back surface of the second wafer 20. It is not necessary to form a large opening in the substrate 200, and hence a loss of the substrate is reduced. In the embodiment as shown in FIG. 7, in a case that a rewiring layer needs to be formed, a part of the substrate 200 should be removed such that the pad 212 is higher than or flush with the substrate 200, and hence the pad 212 is capable to serve as the rewiring layer in a subsequent process. In the embodiment as shown in FIG. 8, the top metal on the substrate 200, that is, the part of the pad 212 located at the back surface of the second wafer 20, may serve directly as the rewiring layer. Hence, the interconnection structure 211 and the second conductive bonding pad 233 in the hybrid bonding structure are formed in different regions, and the pad 212 is formed at the back surface of the second wafer 20, both of which reduce greatly an area occupied by the pad on the bonded wafers. In a specific embodiment, the area may be reduced by fifty percent. After the pad is formed on the bonded wafers, a subsequent process such as packaging may be further performed.

Embodiments of the present disclosure are described in a progressive manner, and one embodiment can refer to other embodiments for the same or similar parts. Each embodiment places emphasis on the difference from other embodiments.

The foregoing embodiments are only preferred embodiments of the present disclosure. The preferred embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made based on the technical essence of the present disclosure without departing the content of the technical solutions of the present disclosure fall within the protection scope of the technical solutions of the present disclosure.

The invention claimed is:

1. A bonding structure, comprising:
    a first wafer, wherein a first hybrid bonding structure is disposed at a front surface of the first wafer, and the first hybrid bonding structure comprises a first dielectric bonding layer and a first conductive bonding pad;
    a second wafer, wherein a front surface of the second wafer is bonded to the front surface of the first wafer, a second hybrid bonding structure is disposed at the front surface of the second wafer, an interconnection structure is disposed in a layer at a side of the second hybrid bonding structure away from the front surface of the second wafer, the second hybrid bonding structure comprises a second dielectric bonding layer and a second conductive bonding pad, and the first wafer and the second wafer are bonded to each other via the first hybrid bonding structure and the second hybrid bonding structure; and
    a pad, which is disposed at a back surface of the second wafer and electrically connected to the interconnection structure, wherein the interconnection structure and the second conductive bonding pad do not overlap with each other when viewed from a direction perpendicular to the front surface of the second wafer,
    wherein slots in adjacent interconnection layers of the interconnection structure do not overlap with each other when viewed from the direction perpendicular to the front surface of the second wafer.

2. The bonding structure according to claim 1, wherein for each layer having two adjacent layers in the interconnection structure,
    one or more vias connecting said layer with one of the two adjacent layers do not overlap one or more vias connecting said layer with another of the two adjacent layers when viewed from the direction perpendicular to the front surface of the second wafer.

3. The bonding structure according to claim 1, wherein the pad is disposed within an opening in a substrate of the second wafer.

4. The bonding structure according to claim 1, wherein a part of the pad is disposed within an opening in a substrate of the second wafer, and another part of the pad is disposed outside the opening and covers a part of a back surface of the second wafer.

5. A method for manufacturing a bonding structure, comprising:
    providing a first wafer, wherein a first hybrid bonding structure is disposed at a front surface of the first wafer, and the first hybrid bonding structure comprises a first dielectric bonding layer and a first conductive bonding pad;
    providing a second wafer, wherein a second hybrid bonding structure is disposed at a front surface of the second wafer, an interconnection structure is disposed in a layer at a side of the second hybrid bonding structure away from the front surface of the second wafer, and the second hybrid bonding structure comprises a second dielectric bonding layer and a second conductive bonding pad;

bonding the front surface of the second wafer to the front surface of the first wafer via the first hybrid bonding structure and the second hybrid bonding structure; and forming a pad at a backside of the second wafer, wherein the pad is electrically connected to the interconnection structure, and the interconnection structure and the second conductive bonding pad do not overlap with each other when viewed from a direction perpendicular to the front surface of the second wafer, wherein slots in adjacent interconnection layers of the interconnection structure do not overlap with each other when viewed from the direction perpendicular to the front surface of the second wafer.

6. The method according to claim 5, wherein for each layer having two adjacent layers in the interconnection structure, one or more vias connecting said layer with one of the two adjacent layers do not overlap one or more vias connecting said layer with another of the two adjacent layers when viewed from the direction perpendicular to the front surface of the second wafer.

7. The method according to claim 5, wherein forming the pad at the backside of the second wafer comprises:

forming an opening in a substrate where the second wafer is located; and forming the pad within the opening.

8. The method according to claim 5, wherein forming the pad at the backside of the second wafer comprises:

forming an opening in a substrate where the second wafer is located; and forming the pad, where a part of the pad is formed within the opening, and another part of the pad is formed outside the opening and covers a part of a back surface of the second wafer.

9. A bonding structure, comprising:

a first wafer segment, wherein a first hybrid bonding structure is disposed at a front surface of the first wafer segment, and the first hybrid bonding structure comprises a first dielectric bonding layer and a first conductive bonding pad;

a second wafer segment, wherein a front surface of the second wafer segment is bonded to the front surface of the first wafer segment, a second hybrid bonding structure is disposed at the front surface of the second wafer segment, an interconnection structure is disposed in a layer at a side of the second hybrid bonding structure away from the front surface of the second wafer segment, the second hybrid bonding structure comprises a second dielectric bonding layer and a second conductive bonding pad, and the first wafer segment and the second wafer segment are bonded to each other via the first hybrid bonding structure and the second hybrid bonding structure; and a pad, which is disposed at a back surface of the second wafer segment and electrically connected to the interconnection structure, wherein the interconnection structure and the second conductive bonding pad do not overlap with each other when viewed from a direction perpendicular to the front surface of the second wafer segment, wherein slots in adjacent interconnection layers of the interconnection structure do not overlap with each other when viewed from the direction perpendicular to the front surface of the second wafer segment.

10. The bonding structure according to claim 9, wherein for each layer having two adjacent layers in the interconnection structure, one or more vias connecting said layer with one of the two adjacent layers do not overlap one or more vias connecting said layer with another of the two adjacent layers when viewed from the direction perpendicular to the front surface of the second wafer segment.

11. The bonding structure according to claim 9, wherein the pad is disposed within an opening in a substrate of the second wafer segment.

12. The bonding structure according to claim 9, wherein a part of the pad is disposed within an opening in a substrate of the second wafer segment, and another part of the pad is disposed outside the opening and covers a part of a back surface of the second wafer segment.

* * * * *